US012571867B2

(12) United States Patent
Liu et al.

(10) Patent No.: US 12,571,867 B2
(45) Date of Patent: Mar. 10, 2026

(54) NUCLEAR MAGNETIC RESONANCE ANALYSIS SYSTEMS AND METHODS

(71) Applicant: UNITED STATES PHARMACOPEIAL CONVENTION, Rockville, MD (US)

(72) Inventors: Yang Liu, Gaithersburg, MD (US); Benjamin Shapiro, Rockville, MD (US); Michael Levy, Herndon, VA (US); Pekka Laatikainen, Kuopio (FI); Reino Olavi Laatikainen, Kuopio (FI)

(73) Assignee: United States Pharmacopeial Convention, Rockville, MD (US)

( * ) Notice: Subject to any disclaimer, the term of this patent is extended or adjusted under 35 U.S.C. 154(b) by 428 days.

(21) Appl. No.: 17/720,389

(22) Filed: Apr. 14, 2022

(65) Prior Publication Data

US 2023/0333184 A1      Oct. 19, 2023

(51) Int. Cl.
*G01R 33/46* (2006.01)

(52) U.S. Cl.
CPC ................................ *G01R 33/4625* (2013.01)

(58) Field of Classification Search
CPC ............................ G01R 33/4625; G01N 24/08
See application file for complete search history.

(56) References Cited

U.S. PATENT DOCUMENTS

| | | | |
|---|---|---|---|
| 4,929,637 A | 5/1990 | Baldwin et al. | |
| 5,332,744 A | 7/1994 | Chakravarty et al. | |
| 7,076,383 B2 | 7/2006 | Schäfer et al. | |
| 7,183,769 B2 | 2/2007 | Kasten et al. | |
| 7,308,365 B2 | 12/2007 | Fiorito et al. | |

(Continued)

FOREIGN PATENT DOCUMENTS

| | | |
|---|---|---|
| CA | 2589497 | 8/2013 |
| EP | 2315085 | 4/2011 |

(Continued)

OTHER PUBLICATIONS

Tiainen et al., "Quantitative Quantum Mechanical Spectral Analysis (qQMSA) of 1H NMR spectra of complex mixtures and biofluids" May 2014, Journal of Magnetic Resonance, vol. 242 p. 67-78, downloaded from https://doi.org/10.1016/j.jmr.2014.02.008 (Year: 2014).*

(Continued)

*Primary Examiner* — Michael J Dalbo
*Assistant Examiner* — Denise R Karavias
(74) *Attorney, Agent, or Firm* — Joseph M. Butscher; Carroll, Hoette & Butscher, LLC

(57) ABSTRACT

A system and method include an analysis control unit configured to receive nuclear magnetic resonance (NMR) data of a sample. A reference database is in communication with the analysis control unit. The reference database stores standard data including information regarding a plurality of standards for chemical compounds, and may also store information regarding quantum mechanical spectral analysis (QMSA) model data and test method data. The analysis control unit is further configured to compare the NMR data with the standard data to determine if the NMR data is associated with one of the plurality of standards, and identify one or more differences between the NMR data and the one of the plurality of standards.

20 Claims, 4 Drawing Sheets

(56) References Cited

U.S. PATENT DOCUMENTS

| | | | |
|---|---|---|---|
| 8,250,020 B2 | 8/2012 | Li et al. | |
| 8,624,599 B2 | 1/2014 | Kamlowski et al. | |
| 10,040,811 B2 | 8/2018 | Diehl | |
| 10,330,613 B2 | 6/2019 | Fischer et al. | |
| 2004/0058386 A1* | 3/2004 | Wishart | G01R 33/4625 |
| | | | 435/7.1 |
| 2006/0155480 A1* | 7/2006 | Kalbitzer | G01N 24/088 |
| | | | 702/22 |
| 2013/0136766 A1* | 5/2013 | Zhou | A61P 3/10 |
| | | | 424/195.15 |
| 2015/0077104 A1* | 3/2015 | Diehl | G01N 24/087 |
| | | | 324/307 |
| 2015/0247813 A1 | 9/2015 | Fischer | |
| 2016/0305896 A1* | 10/2016 | Davis | G01N 24/08 |
| 2018/0203080 A1* | 7/2018 | Acosta | C30B 33/12 |
| 2020/0400766 A1 | 12/2020 | Diehl | |
| 2021/0202079 A1* | 7/2021 | Friebe | G06F 16/9024 |

FOREIGN PATENT DOCUMENTS

| | | |
|---|---|---|
| EP | 2736913 | 8/2015 |
| EP | 4040447 | 8/2022 |
| MX | 2012015021 | 4/2013 |
| PT | 1828160 | 1/2012 |
| PT | 2144912 | 2/2013 |

OTHER PUBLICATIONS

Takis, et al, "Deconvoluting interrelationships between concentrations and chemical shifts in urine provides a powerful analysis tool," Nature Communications | 8: 1662 | DOI: 10.1038/s41467-017-01587-0 | www.nature.com/naturecommunications.

Laatikainen, et al, "New Dimensions of Chemadder: Holistic qQMSA, Virtual 1D HSQC Spectra and Spectra of Millions Transitions," A presentation in Turku XXXIX Finnish NMR symposium, Jun. 7-9, 2017.

Vignoli, et al, "High-Throughput Metabolomics by 1D NMR," Angew. Chem. Int. Ed. 2019.

https://chemrxiv.org/engage/api-gateway/chemrxiv/assets/orp/resource/item/60f8ddb9032114aee3b6f803/original/essential-terminology-connects-nmr-and-q-nmr-spectroscopy-to-its-theoretical-foundation.pdf.

* cited by examiner

NUCLEAR MAGNETIC RESONANCE ANALYSIS SYSTEMS AND METHODS

FIELD OF THE DISCLOSURE

Examples of the present disclosure generally relate to nuclear magnetic resonance (NMR) analysis systems and methods, and, more particularly, to automated systems and methods for standardized analysis of quantitative NMR data.

BACKGROUND OF THE DISCLOSURE

Quantitative nuclear magnetic resonance (qNMR) is used to determine a concentration and purity of chemicals, for example. Certain known software packages are used to facilitate the analysis of NMR data and/or qNMR data. For example, one known software package has features that allow users to predict analytical solutions or manually analyze NMR data by identifying chemical signals through user expertise, and then draw on a spectrum to allow an integral to be calculated and a chemical to be quantified. However, significant user expertise is needed to identify and analyze chemicals. Further, the quantification method is sensitive to differences in approach, meaning two users can follow nearly identical workflows and obtain different answers. Additionally, this approach is time consuming, even for experts.

Spin-systems of coupled nuclear spins interact only weakly with the surroundings of a molecule in solution (which makes the life-times of the nuclear spin-states very long), and therefore, the energetics of the system obeys the laws of quantum mechanics perfectly. As such, transition energies can be calculated theoretically within experimental accuracy from the chemical shifts and coupling constants (parameters describing energy of spins in magnetic field and interaction energies between the spins, respectively). Quantum Mechanical Spectral Analysis (QMSA) of NMR spectra is based on the fact that even very complex NMR spectra can be compressed into a fair number of parameters which are independent of spectrometer magnetic field and insensitive to conditions (for example, temperature, pH, and the like) if they are properly controlled. The parameters are also highly diagnostic to chemical structure. Further, the spectral structures are very diverse and the method is metric (which means minimal need for calibration). Typically, such approach demands sophisticated calculations, but after the spectrum is analyzed (modeled) for one magnetic field, the model can be used to analyze, compare, and identify spectra measured in any magnetic field strength, with even some variations of chemical conditions (for example, concentrations, impurities, such as salts, excipients, and ingredients, pH, solvent, temperature, and the like) being allowed. The more complex the chemical structure, the more diagnostic the spectrum. However, the drawback to using QMSA models is that there is no standard for verifying the quality of the model. Further, the use of models for chemical identification and quantification requires significant expertise and is not feasible for many users.

To facilitate quantum mechanical analysis of qNMR data by QMSA, some software packages allow a user to develop QMSA models and then compare their spectra to the models for identity and quantification testing. Again, however, the drawback is the unknown quality of the model itself, along with significant expertise needed for identification and quantification testing.

United States Pharmacopeial Convention (USP) provides standards (for example, USP standards) that include materials and standard methods for chemical quality analyses. The standards are necessary to ensure the high quality of drugs and medicines. Typically, to compare a potential product in relation to a standard, physical materials are shipped to a consumer, thereby causing delays in their use and manual handling that can degrade the quality of the material in some cases. Further, the standard methods are typically interpreted by human experts, which can lead to human error during testing or analysis.

SUMMARY OF THE DISCLOSURE

A need exists for a system and method for efficiently, effectively, and accurately analyzing sample products, such as chemical compounds. Further, a need exists for a system and method for automatically analyzing sample products, which reduces the potential of human error.

With those needs in mind, certain examples of the present disclosure provide a system including an analysis control unit configured to receive nuclear magnetic resonance (NMR) data of a sample, and a reference database in communication with the analysis control unit. The reference database stores standard data including information regarding a plurality of standards for chemical compounds. The analysis control unit is further configured to compare the NMR data with the standard data to determine if the NMR data is associated with one of the plurality of standards, and identify one or more differences between the NMR data and the one of the plurality of standards.

In at least one example, the standard data includes one or more of chemical standard data, Quantum Mechanical Spectral Analysis (QMSA) model data, and test method data for the plurality of standards.

The sample can be an amount of a drug or medicine. Optionally, the sample can be a supplement, a food, excipient, or the like.

In at least one example, the system also includes a user interface including a display in communication with the analysis control unit.

In at least one example, the analysis control unit is further configured to output a chemical identification test result, which is shown on the display. The chemical identification test result indicates that the sample is associated with the one of the plurality of standards.

In at least one example, the analysis control unit is further configured to output an impurity test result, which is shown on the display. The impurity test result indicates one or more impurities within the sample.

In at least one example, the analysis control unit is further configured to output a quantitative test result, which is shown on the display. The quantitative test result indicates a concentration of the sample.

In at least one example, the system also includes an NMR sub-system. The NMR sub-system operates on the sample to obtain the NMR data. As a further example, the analysis control unit receives the NMR data from the NMR sub-system. As a further example, the analysis control unit is configured to control operation of the NMR sub-system.

Certain examples of the present disclosure provide a method including receiving, by an analysis control unit, nuclear magnetic resonance (NMR) data of a sample; storing, by a reference database in communication with the analysis control unit, standard data including information regarding a plurality of standards for chemical compounds; comparing, by the analysis control unit, the NMR data with the standard data to determine if the NMR data is associated with one of the plurality of standards; and identifying, by the analysis control unit, one or more differences between the NMR data and the one of the plurality of standards.

Certain examples of the present disclosure provide a non-transitory computer-readable storage medium comprising executable instructions that, in response to execution, cause one or more control units comprising a processor, to perform operations comprising: receiving nuclear magnetic resonance (NMR) data of a sample; storing standard data including information regarding a plurality of standards for chemical compounds; comparing the NMR data with the standard data to determine if the NMR data is associated with one of the plurality of standards; and identifying one or more differences between the NMR data and the one of the plurality of standards.

DETAILED DESCRIPTION OF THE DISCLOSURE

The foregoing summary, as well as the following detailed description of certain examples will be better understood when read in conjunction with the appended drawings. As used herein, an element or step recited in the singular and preceded by the word "a" or "an" should be understood as not necessarily excluding the plural of the elements or steps. Further, references to "one example" are not intended to be interpreted as excluding the existence of additional examples that also incorporate the recited features. Moreover, unless explicitly stated to the contrary, examples "comprising" or "having" an element or a plurality of elements having a particular condition can include additional elements not having that condition.

Figure 1:
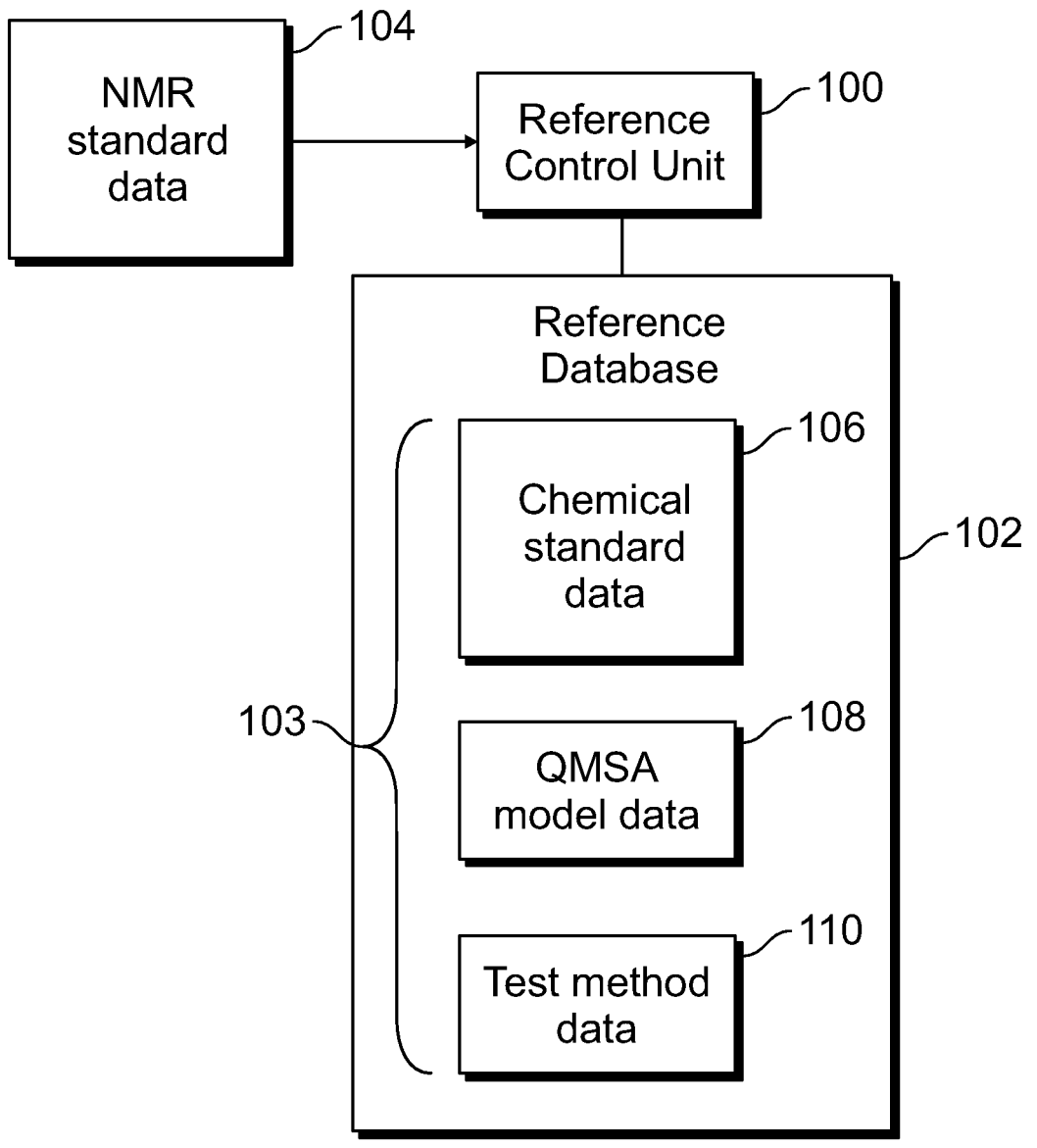
FIG. 1 illustrates a schematic block diagram of a reference control unit in communication with a reference database, according to an example of the present disclosure.

FIG. 1 illustrates a schematic block diagram of a reference control unit 100 in communication with a reference database 102, according to an example of the present disclosure. In at least one example, the reference database 102 is a digital database. Digital information stored therein includes standards, such as reference standards (for example, USP standards). The reference control unit 100 is in communication with the reference database 102, such as through one or more wired or wireless connections. In at least one example, the reference control unit 100 and the reference database 102 are commonly located, such as within a computer workstation. As another example, the reference database 102 can be remotely located from the reference control unit 100. For example, the reference database 102 can be within a network. As a further example, the reference database 102 can be within a cloud network.

The reference control unit 100 receives NMR standard data 104 related to various chemical compounds to determine standards for such chemical compounds. In at least one example, the chemical compounds are related to drugs, medicines, and the like. As an example, the NMR standard data 104 includes information regarding a standard for a particular product, such as a medicine, drug, or other such compound. The standards (for example, USP standards) are developed to provide instructions for safe use of the chemical compounds. For example, United States Pharmacopeia (USP) provides standards that include reference materials and standard methods for chemical quality analyses. In at least one example, the NMR standard data 104 is input into the reference control unit 100. As another example, the NMR standard data 104 is received by the reference control unit 100, such as via a wired or wireless connection with a computing device.

In response to receiving the NMR standard data 104 for a particular chemical compound, the reference control unit 100 converts the NMR standard data to a Quantum Mechanical Spectral Analysis (QMSA) model. The reference control unit 100 then validates the QMSA model. For example, the QMSA model is created based on a standard for a chemical compound. The reference control unit 100 compares the resulting QMSA model in relation to the known standard to ensure that the QMSA model is suitable for use in relation to the standard.

Next, the reference control unit 100 determines test methods for the NMR standard data 104. In at least one example, the test methods are included in the NMR standard data 104. The test methods include instructions for using the chemical compound, such as a drug or medicine. The instructions can include dosage, frequency of use, times of use, storage temperatures, and/or the like.

The reference control unit 100 stores information in the reference database 102. For example, the reference control unit 100 stores standard data 103, which can include one or more of chemical standard data 106, QMSA model data 108, and test method data 110 for the chemical compound in the reference database 102, as determined from the NMR standard data 104. The reference control unit 100 stores such information in the reference database 102 for hundreds, thousands, or more chemical compounds, such as for medicines or drugs, in the reference database 102. As described herein, the information stored in the reference database 102 is compared in relation to sample data of a sample product to determine safety and efficacy of the sample product.

In at least one example, the reference database 102 includes the standard data 103 regarding chemical references that can be created by converting existing standards into quantum mechanical QMSA models of known good quality. The reference database 102 is accessible by an analysis control unit 122 (shown and described with respect to FIG. 2), which can include an application programming interface.

Figure 2:
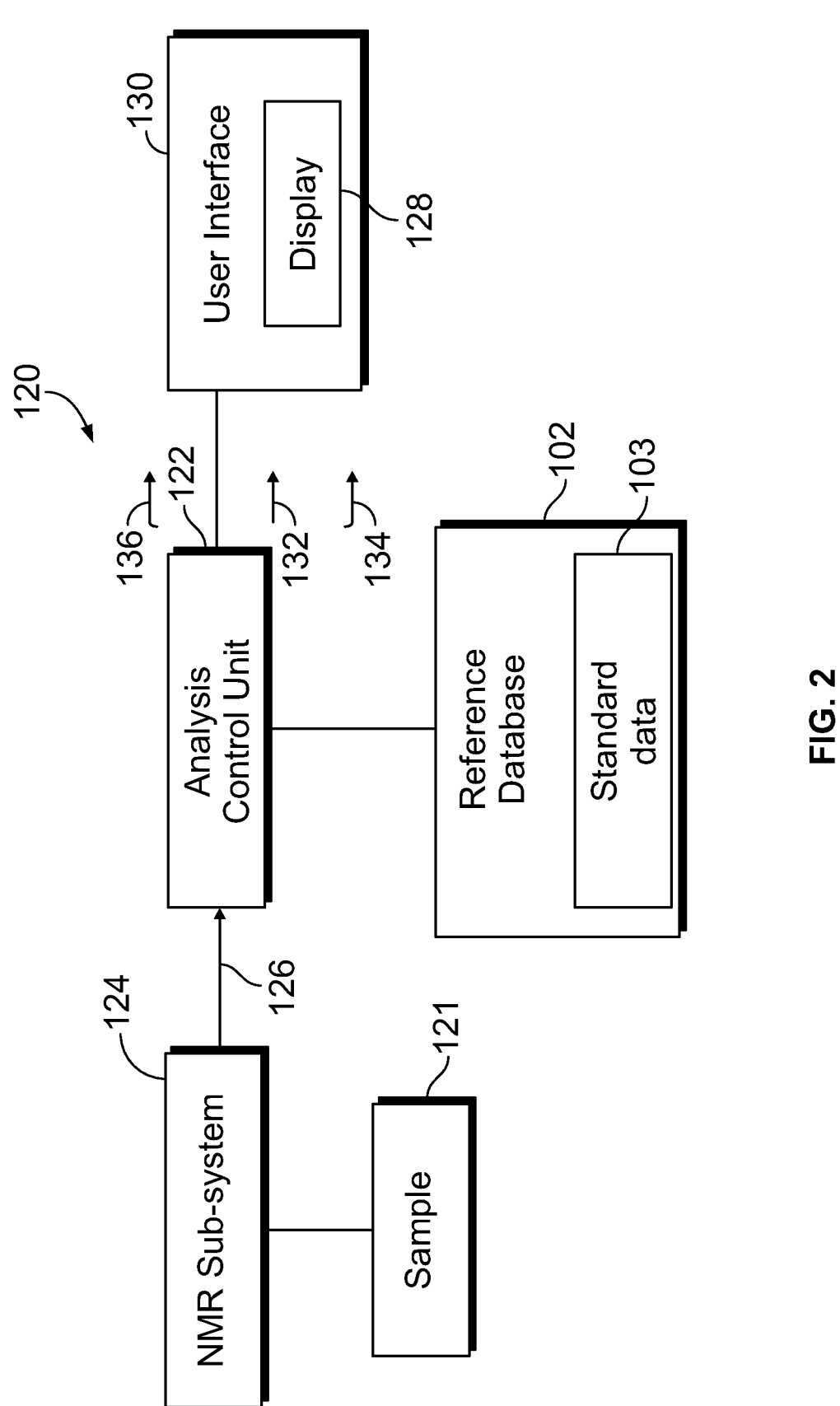
FIG. 2 illustrates a schematic block diagram of a system for standardized nuclear magnetic resonance analysis of a sample, according to an example of the present disclosure.

FIG. 2 illustrates a schematic block diagram of a system 120 for standardized nuclear magnetic resonance analysis of a sample 121, according to an example of the present disclosure. The sample 121 is a sample of a product, such as a drug or medicine. For example, the sample 121 is a particular amount of a chemical compound of a drug or medicine. As another example, the sample 121 is a supplement, such as a dietary supplement. As another example, the sample 121 is a food. As another example, the sample 121 is a vitamin. The sample 121 can be various other example, such as a single compound, a plurality of compounds, or the like, which may or may not include impurities.

The system 120 includes an analysis control unit 122 in communication with the reference database 102, such as through one or more wired or wireless connections. The system 120 further includes an NMR sub-system 124 (that is, a system or device configured for NMR) that is configured to operate on the sample 121 to extract NMR data regarding the sample 121. For example, the NMR sub-system 124 is or include one or more instruments or devices that receive the sample 121. The NMR sub-system 124 then runs and collects spectral data regarding the sample 121 and acquires or otherwise obtains NMR data 126 regarding the sample 121.

In at least one example, the analysis control unit 122 can be in communication with the NMR sub-system 124, such as through one or more wired or wireless connections. In this manner, the analysis control unit 122 can receive the NMR data 126 regarding the sample directly from the NMR sub-system 124. In at least one other example, the analysis control unit 122 receives the NMR data 126 through an intermediate network, such as the cloud, the Internet, or the like.

In at least one example, the analysis control unit 122 is remotely located from the NMR sub-system 124. In at least one other example, the analysis control unit 122 and the NMR sub-system 124 can be at a common location.

In response to receiving the NMR data 126 regarding the sample 121, the analysis control unit 122 compares the NMR data 126 regarding the sample 121 with data regarding a standard (that is, standard data 103) for the sample 121. The standard data 103 is stored in the reference database 102, as described herein. Examples of the standard data 103 include, but are not limited to, chemical standard data 106, QMSA model 108, and test method data 110, as shown in FIG. 1. Optionally, the reference data 103 can include more or less than the chemical standard data 106, the QMSA model 108, and the test method data 110.

In at least one example, the analysis control unit 122 receives the NMR data 126 and searches for and matches the NMR data with a chemical identifier associated with a standard, as stored in the reference database 102. The analysis control unit 122 then outputs a chemical identification test result, which can be shown on a display 128 (such as an electronic monitor or screen) of a user interface 130. The chemical identification test result indicates that the sample 121 is associated with a standard, as stored in the reference database 102. Optionally, if no match exits, the chemical identification test result indicates that the sample 121 does not match any standard, as stored in the reference database 102. The user interface 130 can be a computer workstation, a laptop computer, a handheld device, such as a smart phone or table, or the like.

In at least one example, more than one match can be present. For example, a sample, such as a specific compound, can potentially have multiple components, and/or impurities. The analysis control unit 122 can determine matches for multiple standards. That is, the examples of the present disclosure are not limited to finding only one standard match for a sample.

In at least one example, after matching the NMR data 126 with the chemical identifier associated with a standard, the analysis control unit 122 outputs a chemical identification test signal 132 that includes the chemical identification test result that is then shown on the display 128. The chemical identification test result indicates that the NMR data 126 regarding the sample 121 matches a standard as stored in the reference database 102.

In at least one example, the analysis control unit 122 analyzes an entire NMR spectrum within the NMR data 126 of the sample 121. The analysis control unit 122 identifies chemicals of the sample 121, as determined from the NMR data 126, that match a model in the reference database 102.

The analysis control unit 122 determines a similarity between the identified chemicals with standard data 103 to determine a match score.

Additionally, in at least one example, the analysis control unit 122 compares the NMR data 126 against the standard for the chemical compound, as stored in the reference database 102, to determine impurities in the sample 121. For example, the standard relates to a pure chemical compound. By comparing the NMR data 126 for the sample 121 and determining the differences in relation to the standard, the analysis control unit 122 detects impurities in the NMR data 126. As such, the analysis control unit 122 outputs an impurity test signal 134 that includes the differences, which indicate an impurity test result, which is then shown on the display 128.

In at least one example, the analysis control unit 122 identifies chemical impurities in the sample 121, through the NMR data 126. The analysis control unit 122 can discover, reveal, or otherwise identify spectral structures in the NMR data 126 that do not match chemicals in the reference database 102. Each magnetic nucleus in an NMR spectrum yields spectral structure, which can be singlet, doublet, triplet, or multiplet, which can include thousands of transitions with specific shapes. Spectral structures can include peak patterns or line patterns. A peak pattern or line pattern can be a portion of a spectral structure. As another example, spectral structures can also include one or more humps, with only one maximum. A transition refers to a quantum mechanical transition in which the energy state of a spin system is changed. A line can be composted of one or more transitions. A peak refers to a maximum of spectral structure.

Additionally, in at least one example, the analysis control unit 122 compares the NMR data 126 against the standard for the chemical compound, as stored in the reference database 102 to obtain the concentration of the sample 121 (for example, in mol % or mg/ml), the chemical purity, and/or the like. The analysis control unit 122 outputs a quantitative test signal 136, which is indicative of a quantitative test result regarding the concentration of the sample 121. The quantitative test result, as communicated via the quantitative test signal 136, is then shown on the display 128.

In at least one example, the analysis control unit 122 determines molar concentrations of chemicals within the sample 121, through the NMR data 126. Confidence limits for the results (for example, a molar ratio or mass fraction) are also obtained.

Accordingly, instead of a human being analyzing a physical sample of product in relation to a standard, the analysis control unit 122 receives the NMR data 126 regarding the sample 121. Without human intervention, the analysis control unit 122 then compares the NMR data 126 regarding the sample 121 in relation to the standard data 103 associated with a chemical compound related to the sample 121 (that is, the standard of use for a product, such as the sample 121). The analysis control unit 122 determines and/or identifies the standard associated with the sample 121 based on the stored standard data 103, and outputs one or more signals to the user interface 130, which can then show the standard associated with the sample 121 and any differences on the display 128.

A user can interact with the analysis control unit 122, such as via the user interface, during testing of the sample 121. The analysis control unit 122 also allows reference data and methods to be communicated to the user, such as via the user interface 130. In at least one example, a user loads the NMR data 126 into an application in communication with the analysis control unit 122. The analysis control unit 122 searches the reference database 102 for chemicals contained in the NMR data 126 (which includes spectral data), and determines a matching chemical identity and can also identify a molar ratio of each matched chemical. In at least one example, the analysis control unit 122 also identifies chemical signals that do not match a chemical in the reference database 102, which can indicate the chemical signal is an impurity. In at least one example, the analysis control unit 122 also automatically calculates the molar ratio of chemicals based on the NMR data 126. Absolute concentrations of chemicals can able be calculated, such as when a quantitative internal reference is used.

As described herein, the system 120 includes the analysis control unit 122, which is configured to receive the NMR data 126 of the sample 121. The reference database 102 is in communication with the analysis control unit 122. The reference database 102 stores the standard data 103 including information regarding a plurality of (for example, multiple, numerous, and diverse) standards for chemical compounds. The analysis control unit 122 is further configured to: compare the NMR data 126 with the standard data 103 to determine if the NMR data 126 is associated with one of the plurality of standards, and identify one or more differences between the NMR data 126 and the identified one of the plurality of standards.

In at least one example, the analysis control unit 122 can control the NMR sub-system 124 to operate on the sample 121 without human intervention. For example, the analysis control unit 122 can output control signals to the NMR sub-system 124 to control operation of the NMR sub-system 124 to extract the NMR data 126 from the sample 121. The analysis control unit 122 then analyzes the NMR data 126 in relation to the standard data 103 stored in the reference database 102 to determine if the NMR data 126 matches a standard within the standard data 103, and determine differences between the NMR data 126 and the standard data 103. Based on the determination of the standard and/or differences between the standard and the NMR data 126, the analysis control unit 122 outputs signals to the user interface 130 that control information shown on the display. Further, based on the determination of the standard and/or differences between the standard and the NMR data 126, the analysis control unit 122 can further output control signals to the NMR sub-system 124 to automatically control (that is, without human intervention) the NMR sub-system 124 to further operate on the sample 121 to extract additional NMR data 126.

Figure 3:
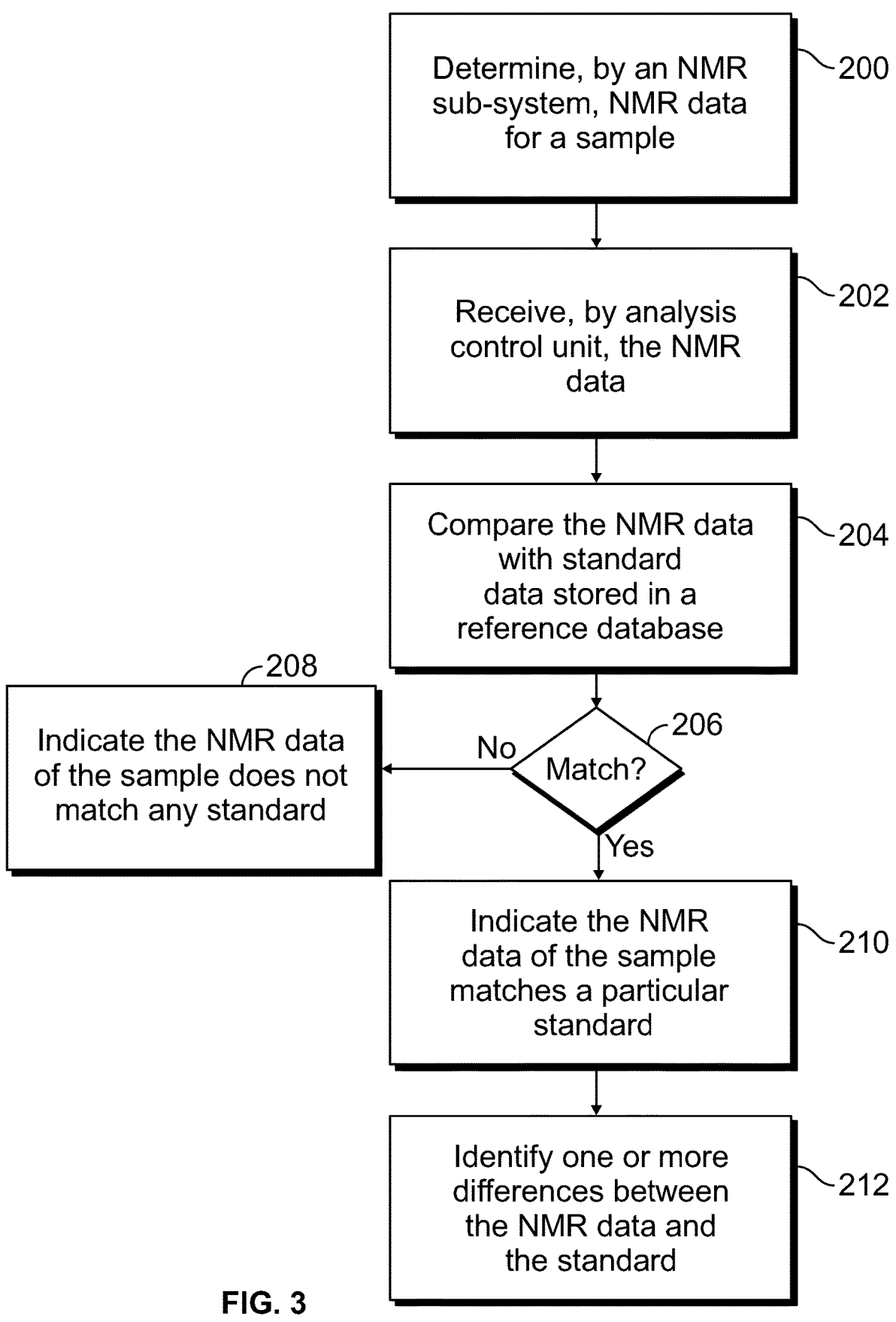
FIG. 3 illustrates a flow chart of a method for standardized nuclear magnetic resonance analysis of a sample, according to an example of the present disclosure.

FIG. 3 illustrates a flow chart of a method for standardized nuclear magnetic resonance analysis of a sample, according to an example of the present disclosure. Referring to FIGS. 1-3, a 200, the NMR sub-system 124 operates on the sample 121 to determine the NMR data 126 for the sample 121. At 202, the analysis control unit 122 receives the NMR data 126 directly or indirectly from the NMR sub-system 124.

At 204, the analysis control unit 122 compares the NMR data 126 with standard data 103 stored in the reference database 102. In at least one example, the standard data 103 includes standards for hundreds, thousands, or more chemical compounds, such as drugs and medicines. At 206, the analysis control unit 122 determines if the NMR data 126 matches a standard for a chemical compound within the standard data 103. If not, the method proceeds to 208, at which the analysis control unit 122 indicates that the NMR data 126 for the sample 121 does not match any standard stored in the reference database 102, which the analysis control unit 122 can show on the display 128.

If, however, the analysis control unit 122 determines that the NMR 126 does match a standard for a chemical compound within the standard data 103, at 210, the analysis control unit 122 indicates that the NMR data 126 of the sample 121 matches a particular standard and identifies the matched standard data, which the analysis control unit 122 can show on the display 128. Next, at 212, the analysis control unit 122 identifies one or more differences between the NMR data 126 of the sample 121 and the matched standard. The analysis control unit 122 can show the one or more differences on the display 128, which allows for a determination regarding whether or not the sample 121 satisfies and/or conforms to the standard. In this manner, the analysis control unit 122 provides an automated analysis of the NMR data 126, without human intervention, which eliminates or otherwise reduces a potential of human error in comparing the sample 121 to a particular standard.

In at least one example, the analysis control unit 122 compares spectral structures within the NMR data 126 for the sample 121 with expected signals from a model, such as a QMSA model, as stored in the reference database 102. The analysis control unit 122 may eliminate chemical components that cannot be matched. In at least one example, the analysis control unit 122 may compare observed line-shape to a line-shape calculated using reference data couplings and optimized observed chemical shifts and line widths (such as between spectral data of the NMR data 126 in relation to a stored model). The analysis control unit 122 can identify chemicals in the sample 121 that match those of a model in the reference database 102, and can further measure similarity between the identified chemicals and the models (and generate a match score).

In at least one example, the analysis control unit 122 may label or otherwise assign signals on a sample spectrum to matched chemicals. The analysis control unit 122 can compare one or more portions of the NMR data 126 in relation to that of a model stored in the reference database 102.

In at least one example, the analysis control unit 122 labels or otherwise assigns signals of the NMR data 126 of the sample 121 to matched chemicals. The analysis control unit 122 compares relative intensity of the assigned signals for each identified chemical. The analysis control unit 122 can then calculate relative concentrations, molar ratios, standard errors, and/or the like. A user can input sample weight or internal standard data. In at least one example, the analysis control unit 122 can then calculate the absolute concentration, such as in mg/mL.

Accordingly, the systems and methods described herein eliminate, minimize, or otherwise reduce shipping delays and handling errors, which can potentially degrade the quality of reference materials. In particular, the NMR data 126 of the sample 121 can be digitally transmitted on demand to avoid shipping delays and handling errors that would otherwise be associated with shipping and handling the sample 121 itself. Digital delivery of standards (for example, the analysis control unit 122 receiving and analyzing the NMR data 126 of the sample 121) ensures that tests can be performed immediately, and fewer errors will be introduced to the process, thereby increasing the quality of the results.

Additionally, the systems and methods described herein eliminate, minimize, or otherwise reduce transcription and interpretation errors when analyzing data. By using the analysis control unit 122, it is expected that individuals with less training and expertise can accurately analyze test results and improve the quality of materials released to the public.

With fewer manual process steps, it is expected that fewer errors will result, and process quality will improve.

Also, the systems and methods described herein eliminate, minimize, or otherwise reduce a potential of failing to detect the presence of impurities and contaminants due to lack of a supplied reference. The systems and methods described herein allow an individual to be able to identify and quantify any detectable chemical with a reference in the database without needing to choose to look for that specific chemical, leading to improved medicine quality by non-targeted detection methods.

Further, qNMR is an analytical technique for chemical structure and concentration determinations, but can otherwise be prohibitively expensive (for example, the expense associated with a high field instrument). Accordingly, examples of the present disclosure described herein enable the interpretation and analysis of benchtop low field spectral data and provides improved results without the need for a large and expensive magnet of an NMR sub-system.

Also, effectively learning how to analyze and interpret qNMR data typically requires significant training and practice, which can last years. Even experts in such process typically spend significant time manually identifying chemicals and integrating signals for quantification. In contrast, the systems and methods described herein allow anyone to quickly and easily identify chemicals, even if the sample is complex, with fewer process steps to avoid user errors that decrease the quality and accuracy of the results.

As used herein, the term "control unit," "central processing unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the reference control unit 100 and the analysis control unit 122 may be or include one or more processors that are configured to control operation, as described herein.

The reference control unit 100 and the analysis control unit 122 are configured to execute a set of instructions that are stored in one or more data storage units or elements (such as one or more memories), to process data. For example, the reference control unit 100 and the analysis control unit 122 may include or be coupled to one or more memories. The data storage units may also store data or other information as desired or needed. The data storage units may be in the form of an information source or a physical memory element within a processing machine.

The set of instructions may include various commands that instruct the reference control unit 100 and the analysis control unit 122 as a processing machine to perform specific operations such as the methods and processes of the various examples of the subject matter described herein. The set of instructions may be in the form of a software program. The software may be in various forms such as system software or application software. Further, the software may be in the form of a collection of separate programs, a program subset within a larger program, or a portion of a program. The software may also include modular programming in the form of object-oriented programming. The processing of input data by the processing machine may be in response to user commands, or in response to results of previous processing, or in response to a request made by another processing machine.

The diagrams of examples herein may illustrate one or more control or processing units, such as the reference control unit 100 and the analysis control unit 122. It is to be understood that the processing or control units may represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the reference control unit 100 and the analysis control unit 122 may represent processing circuitry such as one or more of a field programmable gate array (FPGA), application specific integrated circuit (ASIC), microprocessor(s), and/or the like. The circuits in various examples may be configured to execute one or more algorithms to perform functions described herein. The one or more algorithms may include aspects of examples disclosed herein, whether or not expressly identified in a flowchart or a method.

As used herein, the terms "software" and "firmware" are interchangeable, and include any computer program stored in a data storage unit (for example, one or more memories) for execution by a computer, including RAM memory, ROM memory, EPROM memory, EEPROM memory, and non-volatile RAM (NVRAM) memory. The above data storage unit types are exemplary only, and are thus not limiting as to the types of memory usable for storage of a computer program.

Examples of the subject disclosure provide systems and methods that allow large amounts of data to be quickly and efficiently analyzed by a computing device. For example, the analysis control unit 122 can analyze NMR data 126 for one or more samples 121 in relation to hundreds, thousands, or more standards, as stored in the reference database 102. As such, large amounts of data, which may not be discernable by human beings, are being analyzed. The vast amounts of data are efficiently organized and/or analyzed by the analysis control unit 122, as described herein. The analysis control unit 122 analyzes the data in a relatively short time in order to quickly and efficiently identify a standard associated with the NMR data 126, and any differences therebetween. A human being would be incapable of efficiently analyzing such vast amounts of data in such a short time. As such, examples of the subject disclosure provide increased and efficient functionality, and vastly superior performance in relation to a human being analyzing the vast amounts of data.

In at least one embodiment, components of the system 120, such as the analysis control unit 122, provide and/or enable a computer system to operate as a special computer system for identifying standards associated with NMR data 126 for a sample, and any differences therebetween.

In at least one example, all or part of the systems and methods described herein may be or otherwise include an artificial intelligence (AI) or machine-learning system that can automatically perform the operations of the methods also described herein. For example, the analysis control unit 122 can be an artificial intelligence or machine learning system. These types of systems may be trained from outside information and/or self-trained to repeatedly improve the accuracy with how samples are analyzed in relation to standards. Over time, these systems can improve by matching records with increasing accuracy and speed, thereby significantly reducing the likelihood of any potential errors. The AI or machine-learning systems described herein may include technologies enabled by adaptive predictive power and that exhibit at least some degree of autonomous learning to automate and/or enhance pattern detection (for example, recognizing irregularities or regularities in data), customization (for example, generating or modifying rules to optimize record matching), or the like. The systems may be trained and re-trained using feedback from one or more prior analyses of samples and/or data. Based on this feedback, the systems may be trained by adjusting one or more parameters, weights, rules, criteria, or the like, used in the analysis of the same or other samples. This process can be performed using production data instead of training data, and may be repeated many times to repeatedly improve the matching of samples to standards. The training of the record matching system minimizes false positives and/or false negatives by performing an iterative training algorithm, in which the systems are retrained with an updated set of data and based on the feedback examined prior to the most recent training of the systems. This provides a robust analysis model that can better determine whether samples are associated with the same or different standards while limiting the number of false positives.

Figure 4:
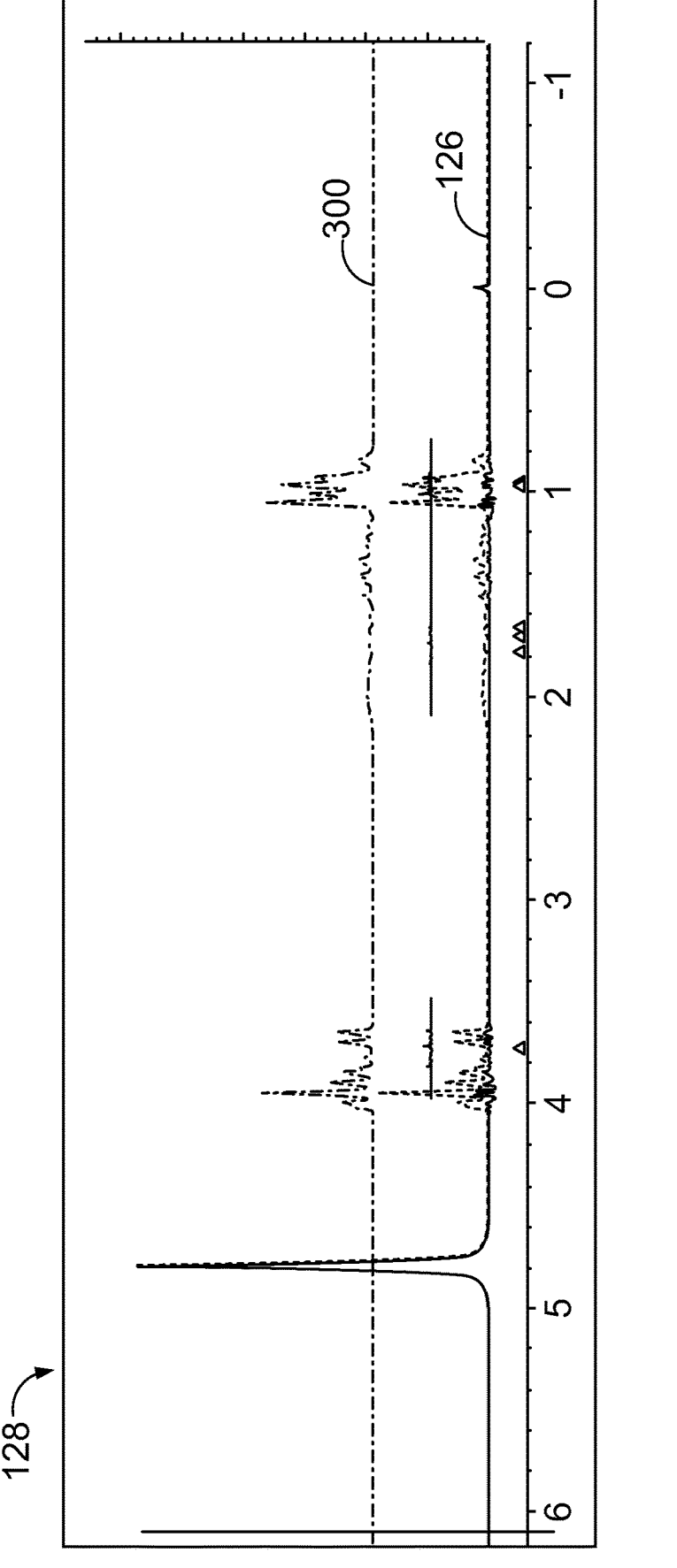
FIG. 4 illustrates a front view of a display showing NMR data in relation to data for a standard, according to an example of the present disclosure.

FIG. 4 illustrates a front view of the display 128 showing NMR data 126 in relation to data 300 for a standard, according to an example of the present disclosure. The data 300 for the standard is within the standard data 103 stored in the reference database 102 (shown in FIGS. 1 and 2). In at least one example, the NMR data 126 is spectral data including a plurality of signals (for example, peaks, curves, or the like) indicative of one or more chemicals. Referring to FIGS. 2 and 4, the analysis control unit 122 can match the NMR data 126 to the data 300 based on the shapes of the signals and the like, thereby associating the NMR data 126 of the sample 121 with a particular standard, as identified by the data 300. The analysis control unit 122 further determines differences between the NMR data 126 and the data 300 (such as via differences in sizes, locations, and/or shapes of respective signals), as described herein, to determine differences between the sample 121 and an associated standard.

It is to be understood that the NMR data 126 and the data 300 shown in FIG. 4 is merely an example. The NMR data 126 and the data 300 can be different than shown.

Further, the disclosure comprises examples according to the following clauses:

Clause 1. A system comprising:

an analysis control unit configured to receive nuclear magnetic resonance (NMR) data of a sample; and a reference database in communication with the analysis control unit, wherein the reference database stores standard data including information regarding a plurality of standards for chemical compounds, wherein the analysis control unit is further configured to:

compare the NMR data with the standard data to determine if the NMR data is associated with one of the plurality of standards, and identify one or more differences between the NMR data and the one of the plurality of standards.

Clause 2. The system of Clause 1, wherein the standard data comprises one or more of chemical standard data, Quantum Mechanical Spectral Analysis (QMSA) model data, and test method data for the plurality of standards.

Clause 3. The system of Clauses 1 or 2, wherein the sample is an amount of a drug or medicine.

Clause 4. The system of any of Clauses 1-3, further comprising a user interface including a display in communication with the analysis control unit.

Clause 5. The system of Clause 4, wherein the analysis control unit is further configured to output a chemical identification test result, which is shown on the display, wherein the chemical identification test result indicates that the sample is associated with the one of the plurality of standards.

Clause 6. The system of Clauses 4 or 5, wherein the analysis control unit is further configured to output an impurity test result, which is shown on the display, wherein the impurity test result indicates one or more impurities within the sample.

Clause 7. The system of any of Clauses 4-6, wherein the analysis control unit is further configured to output a quantitative test result, which is shown on the display, wherein the quantitative test result indicates a concentration of the sample.

Clause 8. The system of any of Clauses 1-7, further comprising an NMR sub-system, wherein the NMR sub-system operates on the sample to obtain the NMR data.

Clause 9. The system of Clause 8, wherein the analysis control unit receives the NMR data from the NMR sub-system.

Clause 10. The system of Clauses 8 or 9, wherein the analysis control unit is configured to control operation of the NMR sub-system.

Clause 11. A method comprising:

receiving, by an analysis control unit, nuclear magnetic resonance (NMR) data of a sample;

storing, by a reference database in communication with the analysis control unit, standard data including information regarding a plurality of standards for chemical compounds;

comparing, by the analysis control unit, the NMR data with the standard data to determine if the NMR data is associated with one of the plurality of standards; and identifying, by the analysis control unit, one or more differences between the NMR data and the one of the plurality of standards.

Clause 12. The method of Clause 11, wherein the standard data comprises one or more of chemical standard data, Quantum Mechanical Spectral Analysis (QMSA) model data, and test method data for the plurality of standards.

Clause 13. The method of Clauses 11 or 12, wherein the sample is an amount of a drug or medicine.

Clause 14. The method of any of Clauses 11-13, further comprising communicatively coupling a user interface including a display with the analysis control unit.

Clause 15. The method of Clause 14, further comprising:

outputting, by the analysis control unit, a chemical identification test result, wherein the chemical identification test result indicates that the sample is associated with the one of the plurality of standards; and showing the chemical identification test result on the display.

Clause 16. The method of Clauses 14 or 15, further comprising:

outputting, by the analysis control unit, an impurity test result, wherein the impurity test result indicates one or more impurities within the sample; and showing the impurity test result on the display.

Clause 17. The method of any of Clauses 14-16, further comprising:

outputting, by the analysis control unit, a quantitative test result, wherein the quantitative test result indicates a concentration of the sample; and showing the quantitative test result on the display.

Clause 18. The method of any of Clauses 11-17, further comprising:

operating on the sample, by an NMR sub-system, to obtain the NMR data; and receiving, by the analysis control unit, the NMR data from the NMR sub-system.

Clause 19. The method of Clause 18, further comprising controlling, by the analysis control unit, operation of the NMR sub-system.

Clause 20. A non-transitory computer-readable storage medium comprising executable instructions that, in response to execution, cause one or more control units comprising a processor, to perform operations comprising:

receiving nuclear magnetic resonance (NMR) data of a sample;

storing standard data including information regarding a plurality of standards for chemical compounds;

comparing the NMR data with the standard data to determine if the NMR data is associated with one of the plurality of standards; and identifying one or more differences between the NMR data and the one of the plurality of standards.

As described herein, examples of the present disclosure provide systems and methods for efficiently, effectively, and accurately analyzing sample products, such as chemical compounds. Further, examples of the present disclosure provide systems and methods for automatically analyzing sample products, which eliminate, minimize, or otherwise reduce the potential of human error.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described examples (and/or aspects thereof) can be used in combination with each other. In addition, many modifications can be made to adapt a particular situation or material to the teachings of the various examples of the disclosure without departing from their scope. While the dimensions and types of materials described herein are intended to define the aspects of the various examples of the disclosure, the examples are by no means limiting and are exemplary examples. Many other examples will be apparent to those of skill in the art upon reviewing the above description. The scope of the various examples of the disclosure should, therefore, be determined with reference to the appended claims, along with the full scope of equivalents to which such claims are entitled. In the appended claims and the detailed description herein, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various examples of the disclosure, including the best mode, and also to enable any person skilled in the art to practice the various examples of the disclosure, including making and using any devices or systems and performing any incorporated methods. The patentable scope of the various examples of the disclosure is defined by the claims, and can include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A system comprising:

a nuclear magnetic resonance (NMR) sub-system configured to operate on a sample to obtain an NMR spectrum of the sample;

an analysis control unit configured to receive the NMR spectrum of the sample obtained by the NMR sub-system; and a reference database in communication with the analysis control unit, wherein the reference database stores a plurality of standards associated with different corresponding chemical compounds and stores quantum mechanical spectral analysis (QMSA) models corresponding to different individual standards of the list of standards in the reference database, wherein the analysis control unit is configured to:

compare the NMR spectrum of the sample with the QMSA models in the reference database;

determine, via the comparison, that the NMR spectrum of the sample matches a first QMSA model of the QMSA models, the first QMSA model associated with a first standard of the standards, the first standard associated with a first chemical compound;

identify that the sample includes the first chemical compound in response to determining that the NMR spectrum matches the first QMSA model;

identify one or more differences between spectral structures within the NMR spectrum of the sample and the first QMSA model;

determine an impurity test result based on the one or more differences that are identified between the NMR spectrum of the sample and the first QMSA model; and output the impurity test result for presentation by a display.

2. The system of claim 1, wherein the sample is an amount of a drug or medicine.

3. The system of claim 1, further comprising a user interface in communication with the analysis control unit, the user interface including the display.

4. The system of claim 3, wherein the analysis control unit is further configured to output a chemical identification test result, which is presented by the display, wherein the chemical identification test result indicates that the sample is associated with the first standard and includes the first chemical compound.

5. The system of claim 3, wherein the analysis control unit is further configured to output a quantitative test result, which is shown on the display, wherein the quantitative test result indicates a concentration of the sample.

6. The system of claim 1, wherein the analysis control unit is configured to control operation of the NMR sub-system.

7. The system of claim 1, wherein the analysis control unit is configured to automatically compare without human intervention, and automatically identify without human intervention by automatically processing NMR spectral data including baseline and phasing prior to analysis, and automatically analyzing the NMR spectral data with the first QMSA model.

8. The system of claim 1, wherein the analysis control unit is also configured to:

determine, via the comparison, that the NMR spectrum of the sample matches a second QMSA model of the QMSA models, the second QMSA models associated with a second standard of the standards, the second standard associated with a second chemical compound;

identify that the sample includes both the first and second chemical compounds in response to determining that the NMR spectrum matches the second QMSA model; and identify one or more differences between the spectral structures within the NMR spectrum of the sample and the second QMSA model.

9. The system of claim 1, wherein the first standard represents a pure state of the first chemical compound, and the impurity test result is a quantitative value that indicates an extent that the NMR spectrum of the sample deviates from the pure state of the first chemical compound.

10. The system of claim 1, further comprising a reference control unit configured to generate the QMSA models based on the corresponding standards and store the QMSA models in the reference database.

11. The system of claim 1, wherein the analysis control unit is configured to display the first QMSA model and the one or more differences on the display.

12. A method comprising:

operating on a sample, by a nuclear magnetic resonance (NMR) sub-system, to generate an NMR spectrum of the sample;

receiving, by an analysis control unit, the NMR spectrum of the sample generated by the NMR sub-system;

storing, by a reference database in communication with the analysis control unit, a plurality of standards associated with different corresponding chemical compounds and a plurality of quantum mechanical spectral analysis (QMSA) models, the QMSA models corresponding to different individual standards of the list of standards in the reference database;

comparing, by the analysis control unit, the NMR spectrum of the sample with the QMSA models in the reference database;

determining, by the analysis control unit, that the NMR spectrum of the sample matches a first QMSA model of the QMSA models, the first QMSA model associated with a first standard of the standards, the first standard associated with a first chemical compound;

identifying, by the analysis control unit, that the sample includes the first chemical compound in response to determining that the NMR spectrum matches the first QMSA model;

identifying, by the analysis control unit, one or more differences between spectral structures within the NMR spectrum of the sample and the first QMSA model;

determining, by the analysis control unit, an impurity test result based on the one or more differences that are identified between the NMR spectrum of the sample and the first QMSA model; and outputting, by the analysis control unit, the impurity test result for presentation by a display.

13. The method of claim 12, wherein the sample is an amount of a drug or medicine.

14. The method of claim 12, further comprising communicatively coupling a user interface with the analysis control unit, the user interface including the display.

15. The method of claim 14, further comprising:

outputting, by the analysis control unit, a chemical identification test result, wherein the chemical identification test result indicates that the sample is associated with the first standard and includes the first chemical compound; and showing the chemical identification test result by the display.

16. The method of claim 14, further comprising:

outputting, by the analysis control unit, a quantitative test result, wherein the quantitative test result indicates a concentration of the sample; and showing the quantitative test result on the display.

17. The method of claim 12, further comprising controlling, by the analysis control unit, operation of the NMR sub-system.

18. The method of claim 12, wherein each of said comparing and said identifying occur automatically without human intervention.

19. The method of claim 12, wherein the first standard represents a pure state of the first chemical compound, and determining the impurity test result comprises calculating, by the analysis control unit, a quantitative value indicating an extent that the NMR spectrum of the sample deviates from the pure state of the first chemical compound.

20. The method of claim 12, further comprising displaying, by the analysis control unit, the first QMSA model and the one or more differences on the display.

\* \* \* \* \*